United States Patent [19]

Okamura et al.

[11] Patent Number: 4,754,242

[45] Date of Patent: Jun. 28, 1988

[54] RESONATOR

[75] Inventors: Hisatake Okamura; Teruhisa Tsuru; Masahiko Kawaguchi, all of Kyoto, Japan

[73] Assignee: Murata Manufacturing Co., Ltd., Kyoto, Japan

[21] Appl. No.: 21,036

[22] Filed: Mar. 2, 1987

[30] Foreign Application Priority Data

Mar. 4, 1986 [JP] Japan .................................. 61-46856
Apr. 25, 1986 [JP] Japan .................................. 61-97311
Apr. 25, 1986 [JP] Japan .................................. 61-97313

[51] Int. Cl.$^4$ ........................ H03H 7/01; H03H 7/09
[52] U.S. Cl. ................................. 333/175; 333/177; 333/184; 333/185
[58] Field of Search ............... 333/167, 168, 172, 175, 333/181-185, 176, 177, 12, 219; 331/96, 107 DP, 117 R, 117 D, 167

[56] References Cited

U.S. PATENT DOCUMENTS 1,568,143  1/1926  Elsasser .............................. 333/168
4,157,517  6/1979  Kneisel et al. ....................... 333/205
4,203,081  5/1980  Braeckelmann ................. 333/177 X
4,614,925  9/1986  Kane ................................. 333/185

FOREIGN PATENT DOCUMENTS 53-40121   9/1978  Japan .
5678572   11/1979  Japan .
0220513  12/1983  Japan .................................. 333/202
0196616  11/1984  Japan .................................. 333/185

OTHER PUBLICATIONS

Ghirardi-"Radio Physics Course", Radio and Technical Publishing Co., New York City, N.Y., Jun. 1937; pp. 172-173.

Primary Examiner—Marvin L. Nussbaum
Attorney, Agent, or Firm—Armstrong, Nikaido, Marmelstein & Kubovcik

[57] ABSTRACT

A resonator comprising an equivalent circuit including an LC series circuit having a first capacitance element and inductance elements connected in series to both sides of the first capacitance element, and a second capacitance element connected parallel to the LC series circuit. A plurality of resonators having this construction may be magnetically connected in series to provide a filter, by utilizing the two inductance elements constituting parts of the resonator and without necessitating separate coupling members such as capacitors or coils.

2 Claims, 4 Drawing Sheets

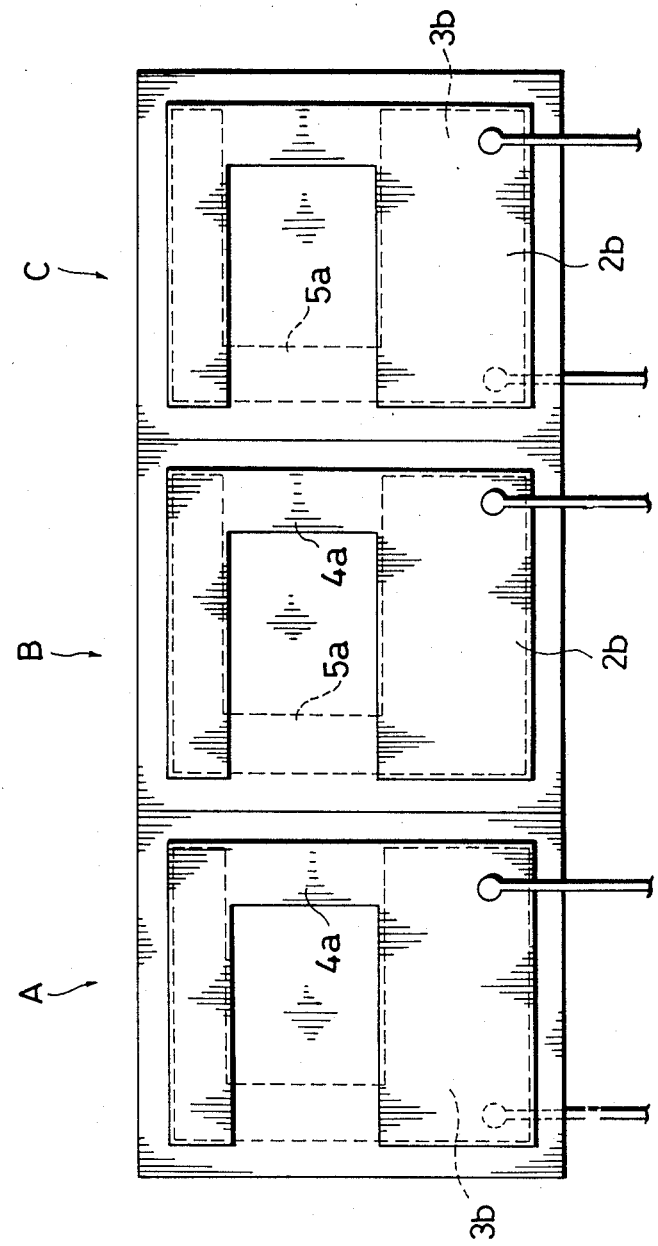

RESONATOR

BACKGROUND OF THE INVENTION (1) Field of the Invention

The present invention relates to a microwave resonator suitable for a filter or an oscillator used in a microwave frequency range including and above the UHF band.

(2) Description of the Prior Art

Examples of known resonators employed in the above frequency range include a dielectric coaxial resonator and a ceramic resonator. The dielectric resonator comprises an equivalent circuit including one capacitance element and one inductance element connected in parallel. On the other hand, the ceramic resonator comprises an equivalent circuit including a series circuit having one inductance element and one capacitance element, and a further capacitance element connected parallel to the series circuit.

Since either resonator includes only one inductance element in the equivalent circuit, it is impossible to magnetically connect a plurality of resonators by utilizing the inductance element. Therefore, a filter formed of resonators connected in a multistep mode requires separate coupling members such as capacitors, and has the disadvantage of being bulky in construction.

SUMMARY OF THE INVENTION

A primary object of the present invention, therefore, is to provide resonators easy to be magnetically connected to each other without necessitating separate coupling members.

Another object of the invention is to provide a small and economical resonator which may be formed by pattern or screen printing on a single dielectric substrate.

In order to achieve the above and other objects, a preferred embodiment of the present invention comprises two pairs of capacitor electrode layers, one layer of each pair formed on each of the front and back faces of a dielectric substrate and opposed to one another across the dielectric substrate, the two capacitor electrode layers formed on each of the front face and back face of the dielectric substrate being interconnected by one coil layer. One pair of capacitor electrode layers opposed to each other across the dielectric substrate constitutes a capacitance element, and each of the coil layers constitutes an inductance element. Therefore, the above resonator comprises a circuit construction in which a capacitance element is connected in parallel in an equivalent manner to an LC series circuit including a capacitance element and inductance elements, the LC series circuit being arranged across the capacitance element.

BRIEF DESCRIPTION OF THE DRAWINGS

These and other objects, advantages and features of the invention will become apparent from the following description thereof taken in conjunction with the accompanying drawings, in which:

FIG. 4 is a front view of a bandpass filter incorporating a plurality of resonators according to the invention.

DESCRIPTION OF THE PREFERRED EMBODIMENTS

Figure 1:
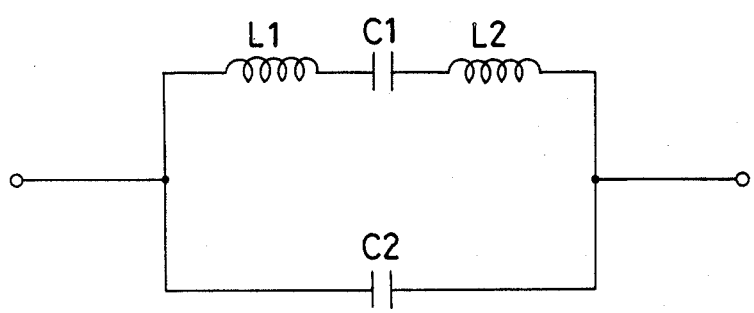
FIG. 1 is a view of an equivalent circuit diagram illustrating a resonator according to the invention.
Figure 2A:
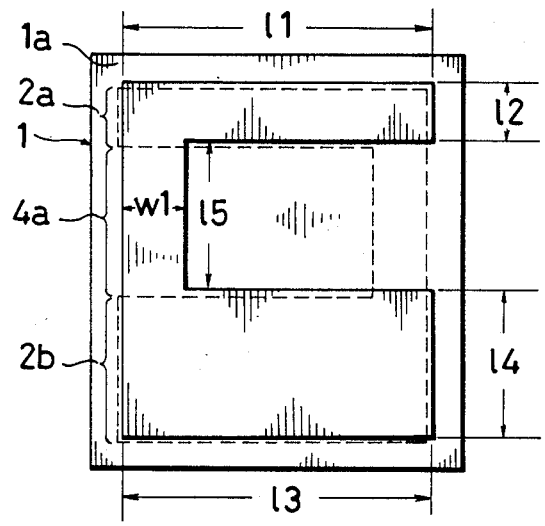
FIG. 2A is a front view of a specific example of resonator a according to the invention.
Figure 2B:
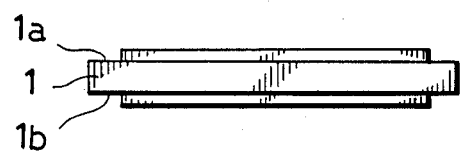
FIG. 2B is a bottom view of the resonator shown in FIG. 2A.
Figure 2C:
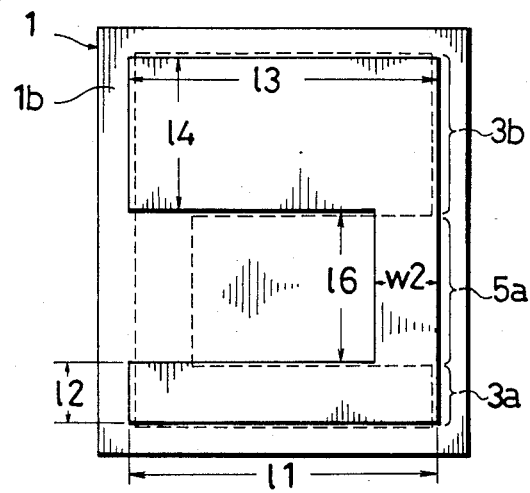
FIG. 2C is a rear view of the resonator shown in FIG. 2A.

As shown in FIG. 1, a resonator according to the present invention comprises an equivalent circuit including an LC series circuit having a first capacitance element C1 and inductance elements L1 and L2 connected in series to both sides of the first capacitance element C1, and a second capacitance element C2 connected in parallel to the LC series circuit. As shown in FIGS. 2A, B, C, the resonator comprising this equivalent circuit is formed on a dielectric plate or substrate. In FIGS. 2A, B, C, number 1 denotes the dielectric substrate which may be of a ceramic or other dielectric material. The substrate 1 has a front face 1a and a back face 1b including, respectively, capacitor electrode layers 2a, 2b, 3a and 3b and coil layers 4a and 5a which are formed, for example, of screen printed silver paste. The electrode layers 2a and 3a are opposed to each other across the substrate 1 along one side thereof, one on the front face 1a and the other on the back face 1b. Likewise, the electrode layers 2b and 3b are opposed to each other across the substrate 1 along the opposite side thereof. Therefore, the electrode layers 2a, 2b, 3a and 3b constitute the capacitance elements C1 and C2 having capacities determined by the permittivity and thickness of the substrate 1 and by the areas over which the capacitor electrodes layers are opposed to each other. On the other hand, the coil layers 4a and 5a are formed so as to connect the two capacitor electrode layers 2a and 2b on the front face of substrate 1, and the two capacitor electrode layers 3a and 3b on the back face of substrate 1, at opposite ends of the substrate, respectively. The coil layers 4a and 5a constitute the inductance elements L1 and L2 in high frequency.

In the resonator according to this embodiment particularly, the two coil layers 4a and 5a have a selected length and are formed close to ends of the substrate 1 so that the resonator may be magnetically connected to other resonators. Further, it is desirable that the two coil layers 4a and 5a in one resonator be spaced from each other as much as possible in order to prevent the coil layers 4a and 5a from being magnetically connected to each other and from having an electrostatic capacity. In the illustrated example the coil layers 4a and 5a are spaced from each other to a maximum extent.

To resonate this resonator in fr=504 MHz, L1 and L2 are derived, for example, from the following equation provided C1=18 pF:

$$fr = \frac{1}{2\pi \sqrt{(L1 + L2)C1}}$$

Figure 3:
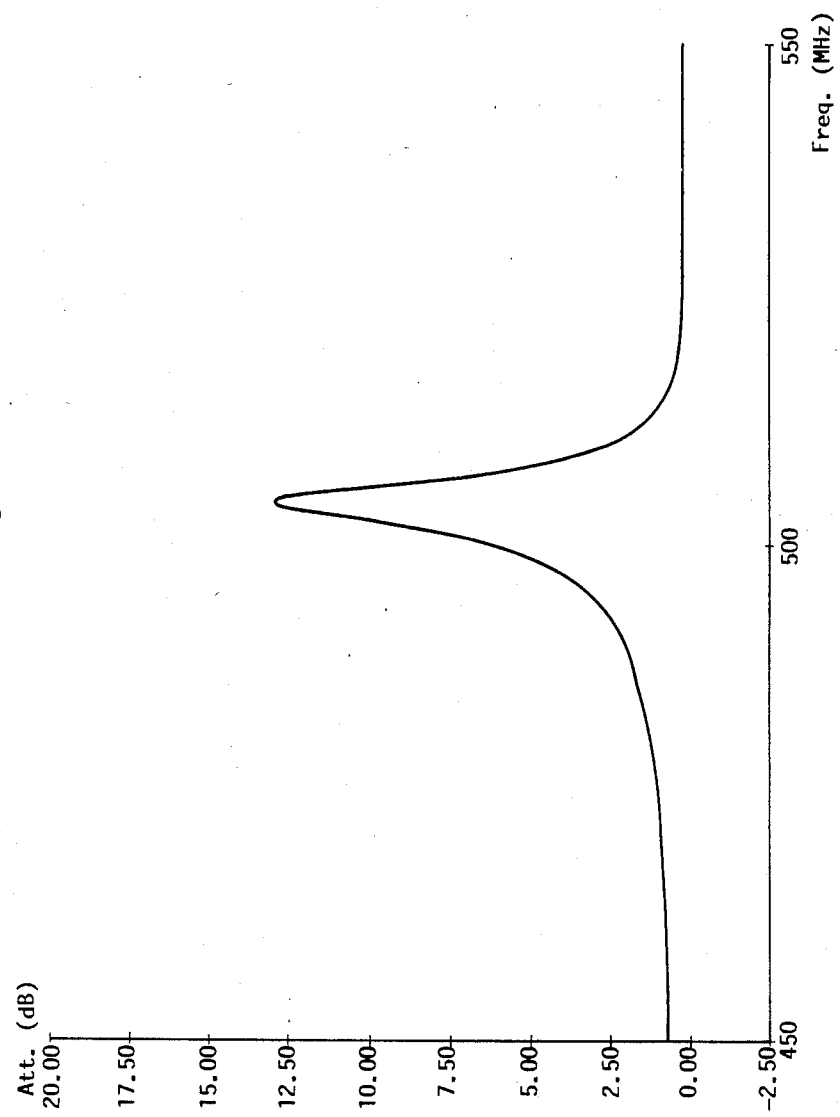
FIG. 3 is a view showing frequency characteristics of the resonator.

If L1=L2 here, then L1=L2=2.77 nH. C2 may be selected according to an impedance applied, regardless of the resonant frequency. For this embodiment 53 pF was selected since C2=53 pF resulted in a maximum value of Q factor when the impedance was 50Ω. Where the dielectric substrate 1 has a permittivity ε set to 80 and a 0.4 mm thickness, the capacitance elements C1 and C2 having the above electrostatic capacity are realized by selecting the dimensions to be l1=7 mm, l2=1.5 mm, l3=7 mm and l4=3.5 mm. The inductance of inductance elements L1 and L2 is realized by selecting the dimension l5=l6=6 mm. The coil layers 4a and 5a have width W1, W2 which are not related to the inductance value. However, the greater the width, the smaller is the resistance and the higher becomes the value of Q factor which is desirable. In this example, W1=W2=1.5 mm. FIG. 3 shows frequency characteristics of the resonator incorporating the specific dimensions noted above. As seen from the characteristics, a very high value of Q factor 148 has been achieved. The reasons for making such a very high value of Q factor possible appear to be that the above resonator comprises the peculiar equivalent circuit construction that find no parallel in the prior art, and that the resistance has been reduced by increasing the width of the coil layers 4a and 5a.

It will be understood that in the above resonator the dielectric substrate 1 has the capacitor electrode layers 2a, 2b, 3a and 3b and the coil layers 4a and 5a formed in the same pattern on its front face and back face. By uniformalizing the pattern for the front and back faces, printing masks of the same pattern may be used for manufacture which leads to a very high productivity.

While in the above embodiment the dielectric substrate 1 has the 0.4 mm thickness, by varying its thickness the capacity of the capacitance elements C1 and C2 may be varied to realize different resonant frequencies. Therefore, the thickness of substrate 1 may be selected to be appropriate with relation to a frequency to be used.

FIG. 4 is a front view of an example of a bandpass filter where three of the resonators as in the foregoing embodiment are magnetically interconnected. In this example, three resonators A, B and C are arranged in a multistep mode and are interconnected by a magnetic coupling occuring between coil layers 4a and 5a of the adjacent resonators. As illustrated by this example, the resonators A, B and C may just be arranged side by side to establish the magnetic connection therebetween, which is made possible by forming the coil layers close to the ends of the dielectric substrate 1.

Although the present invention has been fully described by way of examples with reference to the accompanying drawings, it is to be noted that various changes and modifications will be apparent to those skilled in the art. Therefore unless otherwise such changes and modifications depart from the scope of the present invention, they should be construed as being included therein.

What is claimed is:

1. A microwave resonator device comprising a circuit including a first capacitance element and first and second inductance elements connected in a series circuit with said first capacitance element, one said inductance element being connected at each side of said first capacitance element, and a second capacitance element connected in parallel with said series circuit, said resonator device comprising:
   a dielectric substrate having a front face and a back face;
   a first pair of capacitor electrodes forming said first capacitance element, one electrode of said first pair being formed along one side of each of said front and back faces of said substrate, respectively, said first pair of said electrodes being opposed to one another across the substrate;
   a second pair of capacitor electrodes forming said second capacitance element, one electrode of said second pair being formed, respectively, along a second side of each of said front and back faces of said substrate opposite to said one side of said substrate, said second pair of electrodes being opposed to each other across the substrate;
   a first coil layer forming said first inductance element formed on said first face of said substrate, along one end thereof, connecting said electrodes of said first and second capacitance elements formed on said first face; and
   a second coil layer forming said second inductance element formed on said second face of said substrate, along another end thereof opposite said one end, connecting said electrodes of said first and second capacitance elements formed on said second face of said substrate.

2. A resonator as claimed in claim 1 wherein said dielectric substrate is formed of a ceramic material.

* * * * *